United States Patent
Goozner et al.

[11] Patent Number: 5,897,685
[45] Date of Patent: Apr. 27, 1999

[54] RECYCLING OF CDTE PHOTOVOLTAIC WASTE

[75] Inventors: Robert E. Goozner; Mark O. Long; William F. Drinkard, Jr., all of Charlotte, N.C.

[73] Assignee: Drinkard Metalox, Inc., Charlotte, N.C.

[21] Appl. No.: 08/855,873

[22] Filed: May 12, 1997

[51] Int. Cl.⁶ ................................................. C21B 15/00
[52] U.S. Cl. ............................................. 75/743; 75/711
[58] Field of Search ........................... 75/743, 710, 711; 423/109

[56] References Cited

U.S. PATENT DOCUMENTS 5,431,713   7/1995   Meyerson et al. ......................... 75/743
5,779,877   7/1998   Drinkard, Jr. et al. .................... 75/743

OTHER PUBLICATIONS

Copper, Chapter 8, Electrolytic Refining pp. 165–222, Eichrodt et al, Dec. 1954.
Tolley et al, Report of Investigations–9588 "Recovering Cadmium and Tellurium From Thin Film Photovoltaic Device Scrap", US Bureau of Mines, Dec. 1995.

*Primary Examiner*—Scott Kastler
*Attorney, Agent, or Firm*—Dougherty & Associates

[57] ABSTRACT

A method for extracting and reclaiming metals from scrap CdTe photovoltaic cells and manufacturing waste by leaching the metals in dilute nitric acid, leaching the waste with a leaching solution comprising nitric acid and water, skimming any plastic material from the top of the leaching solution, separating the glass substrate from the liquid leachate, adding a calcium containing base to the leachate to precipitate Cd and Te, separating the precipitated Cd and Te from the leachate, and recovering the calcium-containing base.

13 Claims, 3 Drawing Sheets

RECYCLING OF CDTE PHOTOVOLTAIC WASTE

This invention was made with U.S. Government support under contract No. DE-FG02-95ER81951 from the U.S. Department of Energy. The U.S. Government has certain rights in this invention.

FIELD OF THE INVENTION

This invention relates to a process for removing metals from photovoltaic waste and, more particularly, to a hydrometallurgical process for removing metals from photovoltaic waste enabling the waste to pass toxic characteristic leaching procedure (TCLP) and to selectively recover the solubilized metals for reuse.

BACKGROUND OF THE INVENTION

Thin film photovoltaic (PV) modules promise to be one of the leading edge power generation technologies of the twenty-first century. More and more attention is being drawn to the potential benefits of using thin film photovoltaic technology and, consequently, production of photovoltaic modules has risen in response to increased demand. However, a number of the metals needed to manufacture thin film photovoltaic modules are generally considered to be hazardous and can cause environmental health and safety hazards. An ever growing amount of manufacturing waste and disposal of photovoltaic modules accompanies the increased demand for photovoltaic technology and photovoltaic module production. The landfilling of superannuated photovoltaic modules and manufacturing waste associated with photovoltaic cells can release hazardous materials into the environment.

Some of the major elements or compounds used in photovoltaic cells are cadmium, selenium, tellurium and indium. Cadmium is the principal material used in the process of making photovoltaic cells, particularly CdTe modules, and is a secondary component in CIS (Copper Indium Diselenide) photovoltaic modules. The principal effects of continued exposure to low levels of cadmium are significantly apparent on the kidneys, lungs and bones. Cadmium may be fatal if inhaled and is also harmful if swallowed or absorbed through the skin. Prolonged exposure to cadmium can cause stomach pains, vomiting, diarrhea, lung irritation, chest pain and edema. The U.S. Environmental Protection Agency has concluded that the inhaled inorganic cadmium compounds are probable human carcinogens.

Tellurium may be fatal if inhaled, swallowed or absorbed through the skin. Inhalation of tellurium may result in fatality as a consequence of spasm, inflammation and/or edema of the larynx and bronchi, chemical pneumonitis and pulmonary edema. Exposure to tellurium can cause nausea, headache and vomiting.

The most primary regulatory test to evaluate the toxicity of photovoltaic manufacturing waste and superannuated modules is EPA TCLP (Toxicity Characteristic Leaching Procedure, 40 C.F.R. Ch. 1, Pt. 261, App. II). TCLP requires recycling processes to meet exacting standards.

CIS (Cadmium Indium Diselenide) photovoltaic modules generally contain between 5 and 14 g of Cd or Se per square meter of module. We have observed CdTe modules to contain between 7 and 12 g of Cd or Te per square meter of module. Additional sources of Cd and Te come from manufacturing debris from the fabrication of the photovoltaic modules. The manufacturing waste typically includes CdS, CdTe and various non-stoichiometric mixtures containing Cd, Te and Zn. The hazardous metals involved in photovoltaic module manufacturing and waste have high potential for impacting the environment.

DESCRIPTION OF THE RELATED ART

Applicants are aware of the following U.S. Patents and publications concerning recovery of metals.

| U.S. Pat. No. | Inventor | Issue Date | Title |
|---|---|---|---|
| 4,163,046 | Subramanian et al. | 07-31-1979 | RECOVERY OF SELENIUM |
| 4,244,936 | Victor et al. | 01-13-1981 | RECOVERY OF TELLURIUM FROM ACIDIC SULFONATED ION EXCHANGE RESINS BY ACID ELUTION |
| 4,519,913 | Baldwin et al. | 05-28-1995 | PROCESS FOR THE REMOVAL AND RECOVERY OF SELENIUM FROM AQUEOUS SOLUTIONS |
| 4,770,700 | Bertha et al. | 09-13-1988 | HYDROMETALLURGICAL PROCESS FOR THE SEPARATION AND ENRICHMENT OF GOLD, PLATINUM, AND PALLADIUM, TOGETHER WITH RECOVERY OF SELENIUM FROM THE ANODE SLUDGE OF COPPER ELECTROLYSIS |
| 5,405,588 | Kronberg | 04-11-1995 | PROCESS FOR REMOVING CADMIUM FROM SCRAP METAL |
| 5,407,463 | van Erkel | 04-18-1995 | RECOVERY OF CD AND NI FROM BATTERIES |
| 5,431,713 | Myerson et al. | 07-11-1995 | METHOD FOR THE RECLAMATION OF METALLIC COMPOUNDS FROM ZINC AND LEAD CONTAINING DUST |
| 5,453,111 | Myerson et al. | 09-26-1995 | METHOD FOR SEPARATION OF METALS FROM WASTE STREAM |

| PAPERS | |
|---|---|
| Title | Author |
| COPPER: THE SCIENCE AND TECHNOLOGY OF THE METAL ITS ALLOYS AND COMPOUNDS | A. Butts |
| METALS RECYCLING FROM INDUSTRIAL SOLID WASTES | L. W. Lherbier & J. F. Pusateri |
| RECYCLING OF CADMIUM AND SELENIUM FROM PHOTOVOLTAIC MODULES AND MANUFACTURE WASTE: A WORKSHOP REPORT | P. Moskowitz & K. Zweibel R. H. Hanewald et al. |
| RECYCLING NICKEL-CADMIUM BATTERIES THROUGH THE HIGH TEMPERATURE METAL RECOVERY PROCESS | W. Tolley and G. Palmer |
| RECOVERING CADMIUM AND TELLURIUM FROM THIN FILM PHOTOVOLTAIC DEVICE SCRAP | |

Myerson et al., U.S. Pat. No. 5,453,111, teaches a method for the recovery of metals including zinc, zinc oxide, iron-carbon feedstocks, lead and cadmium from industrial waste streams which entails treating the waste streams with carbon and an ammonium chloride solution, separating any undissolved components from the solution, displacing metal ions including lead and cadmium from the solution using zinc metal, treating the solution to remove zinc compounds therefrom, followed by treating the zinc compounds and the undissolved components with a dissolving solution, and further treating the displaced metals ions to recover lead, cadmium and zinc therein using various methods including electrolysis.

Myerson et al., U.S. Pat. No. 5,431,713, teaches a method for the reclamation of zinc, lead, tin, cadmium, and copper from dust containing such elements or compounds which involves leaching the dust with sulfuric acid or ammonium bisulfite, neutralization of the leachate with zinc oxide or zinc hydroxide, and cementing and/or roasting various intermediate and final products for the reclamation of the above metals. The method is especially designed for reclaiming the above metals from waste streams of electrical conductor production processes. The method is a continuous method with a recirculation of the remaining solutions after the completion of each step.

Baldwin et al., U.S. Pat. No. 4,519,913, teaches a process for reducing the concentration of water soluble ionic selenium species in aqueous waste solutions containing the same. The process involves passing the waste solution through a treatment zone containing a porous matrix on which are retained populations of at least one bacteria of the genus Clostridium. The passing of the aqueous solution through the treatment zone is carried out at predetermined rates of flow, and contact between the solution and the bacteria is conducted under anaerobic conditions at predetermined pH and temperature levels. The process provides for the conversion of the water soluble ionic selenium species to water insoluble selenium metal, which metal is retained on the porous matrix and can be recovered therefrom.

Van Erkel, U.S. Pat. No. 5,407,463, teaches a method for recovering cadmium, nickel and iron from batteries containing the steps of: (a) reducing the size of the batteries to small pieces and separating the pieces into a coarse fraction and a fine fraction with the coarse fraction further separated into a magnetic and non-magnetic fraction; (b) leaching out the fine fraction at approximately 90° C.; (c) removing the Cd; (d) stripping the extractant and separating the cadmium therefrom; (e) converting the iron ions into solid iron (III) hydroxide then filtering; and (f) recovering Ni from the filtrate.

Kronberg, U.S. Pat. No. 5,405,588, teaches a process for recovering cadmium from scrap metal. Cadmium-containing scrap is mixed with an ammonium carbonate solution containing an amine and oxidizing agent thereby forming a cadmium-amine complex. The solution is evaporated to form a cadmium carbonate mixture, and the cadmium is separated out by means of hydrogen sulfide. This process yields a sulfide product requiring further processing to remove the sulfur.

Victor et al., U.S. Pat. No. 4,244,936, teaches a process for the recovery of tellurium compounds which have been retained on a strongly acidic sulfonated ion exchange resin. The resin is employed to remove soluble tellurium compounds from tellurium-containing vicinal glycol ester solutions, by elution of the resin with dilute mineral acids, such as hydrochloric, to form a tellurium-containing acid eluate and treating the eluate by stripping or distilling to remove contained water and acid. This leaves a tellurium compound concentrate which may be treated in the presence of air or oxygen to convert the tellurium to a form suitable for reuse in the preparation of vicinal glycol esters. This method for tellurium recovery entails the use of expensive ion exchange resins.

Bertha et al., U.S. Pat. No. 4,770,700, teaches a hydrometallurgical process for enrichment of gold, platinum and palladium from copper electrolysis anode sludge and simultaneous recovery of selenium. The sludge is treated with $Cl_2/HCl$ to transform the selenium of a hexavalent state and precipitate out silver chloride. The filtrate is then subjected to selective reduction of precipitate. The noble metals and resulting filtrate are chlorinated and a further reduction is effected to precipitate the metallic selenium.

Subramanian et al., U.S. Pat. No. 4,163,046, teaches a hydrometallurgical process for treating copper refinery anode slimes containing selenium, lead and precious metals in which a selenium product of better than 99.7% purity can be produced and the final residue is suitable for smelting to produce anodes for silver refining.

The patents mentioned above are not specifically directed at recovering metals from photovoltaic waste.

Proposed methods for the recovery of cadmium and selenium from photovoltaics (P. Moskowitz & K. Zweibel, Recycling of Cadmium and Selenium From Photovoltaic Modules and Manufacture Waste: A Workshop Report, Mar. 11–12, 1992 BNL 47787) treat the photovoltaics similar to the recycling of waste Ni-Cd batteries. Ni-Cd battery recycling schemes are either pyrometallurgical or hydrometallurgical in nature.

A pyrometallurgical method has been developed by INMETCO (R. H. Hanewald et al., "Recycling Nickel-Cadmium Batteries Through The High Temperature Metal Recovery Process", Proc. 6th International Seminar on Battery Waste Management, Oct. 31–Nov. 2, 1994). The INMETCO process has a high energy requirement typical for furnaces. The cadmium from the INMETCO process is retrieved in a wet cake mixed with zinc and lead which must be sent to another processor for further refining.

A hydrometallurgical method to recycle Ni-Cd batteries has been presented by Leto Recycling (R. H. Hanewald et al., "Recycling Nickel-Cadmium Batteries Through The High Temperature Metal Recovery Process", Proc. 6th International Seminar on Battery Waste Management, Oct. 31–Nov. 2, 1994). The Leto process is a 16-step process based upon a HCl leach followed by solvent extraction. The chloride leachates involved are highly corrosive to process equipment. The solvent extraction is also a costly process. The authors state that the process is uneconomical and a cost (or fee) of $0.60–0.80 per kg of batteries is necessary.

Another strategy to recycle photovoltaic waste is to incorporate it into a process which recycles electric arc furnace (EAF) dust, a material which also has a high percentage of Cd. One processing technology for EAF dust is the flame reactor developed by Horsehead (EPA/540/R-94/526, "Superfund Innovative Technology Evaluation Program", p. 84 (1994); EPA/540/5-91/008, The Superfund Innovative Technology Evaluation Program, 4th Ed., November (1991); EPA/540/R-92/076, The Superfund Innovative Technology Evaluation Program, 5th Report to Congress, October 1992; L. W. Lherbier & J. F. Pusateri, "Metals Recycling From Industrial Solid Wastes," Emerging Technologies in Hazardous Waste Management, Sept. 27–29 (1993), I&EC of the ACS, p. 855). This technology exposes waste solids to temperatures greater than 2,000° C. The results of this process are nonleachable slag combined with metal oxides and a metal alloy. The process has a high energy consumption requirement and produces end products with little or no commercial value which must be sent to a landfill. This technology does not produce a recycle of the Cd, but immobilizes it in the slag sufficiently to pass TCLP. The flame reactor does not produce streams of salable or directly reusable chemicals from the photovoltaic scrap. Furnace technology of this type is also capital-intensive, has a high energy requirement, and does not address processing Te, In and Se.

Significant experimental work performed on CdTe scrap recycling has been performed by W. Tolley and G. Palmer (W. Tolley and G. Palmer, Recovering Cadmium and Tellurium From Thin Film Photovoltaic Device Scrap, U.S. Dept. of the Interior, U.S. Bureau of Mines, RI9588, 1995). This process was based upon leaching the scrap in an acidic ferric chloride solution. In order to achieve efficient extraction of the cadmium and tellurium from the scrap the process required a pressure autoclave at 400 psig at 110° C. under an oxygen atmosphere. These extreme conditions make this process unattractive to scale up to in-situ recycling of PV waste. The pressure autoclave is capital intensive and can pose safety concerns. The introduction of iron as ferric chloride dilutes and contaminates the photovoltaic metals preventing recovery in sufficient purity to allow for direct reuse or high value sale.

The removal of selenium and tellurium from electrolytic copper refinery anode slimes are described by Butts (A. Butts, Cooper: The Science and Technology of the Metal Its Alloys and Compounds, Reinhold, New York, 1954, p. 270). The three methods of winning selenium are: (1) smelting with soda and niter; (2) roasting with soda; and (3) roasting with sulfuric acid. Tellurium is removed from the slimes as water-soluble tellurite. The tellurite is made following an initial oxidizing or sulfating treatment by one of three ways: (1) roasting or baking a slimes-soda mix; (2) refining with soda in a dore or cupellating furnace; and (3) boiling the slimes with caustic soda after an oxidizing or sulfating roast. These methods yield incomplete separation of selenium and tellurium. Application of this method involving roasting to photovoltaic modules is a non-viable option when volatile cadmium components are present.

As applied to the recycle of PV semiconductor materials, all of the above approaches are economically and environmentally inefficient by diluting valuable PV materials and contaminating them so that recovery in reusable form is both difficult and expensive. It is therefore apparent that what is needed is a method to process thin film photovoltaic waste that removes hazardous metals from scrap thin film photovoltaic cells and photovoltaic manufacturing waste. Further needed is a method to process thin film photovoltaic waste that provides for cost-efficient removal of cadmium and tellurium. Further needed is a method to process thin film photovoltaic waste that recycles photovoltaic metals from PV related products and manufacturing waste and produces salable and directly reusable metals. Further needed is a method to process thin film photovoltaic waste that enables the waste to pass TCLP. As pure materials, the reclaimed metals can be sold to vendors in the photovoltaic industry or to other metallurgical-based industries.

SUMMARY OF THE INVENTION

The present invention is a method to process thin film photovoltaic waste that removes hazardous metals from scrap thin film photovoltaic cells and photovoltaic manufacturing waste. Virtually complete removal of the photoactive metals is attained. The cells and waste are leached by an acidic leaching solution to remove the metals. A glass substrate is removed and can be reused in the manufacture of photovoltaic cells, recycled or disposed as a non-hazardous waste in a landfill. A laminating plastic is skimmed from the leaching solution. The leaching solution is neutralized by a calcium-containing base and forms a solid precipitate of Cd and Te. The solid precipitate is roasted, cooled and washed to recover CdO and TeO. The present invention separates out cadmium and tellurium for recovery as pure metal or for reuse in photovoltaic cell manufacture. Any NOx generated during the process steps is captured and recycled as nitric acid for reuse in the process.

OBJECTS OF THE INVENTION

It is the principal object of the present invention to provide a method to process thin film photovoltaic waste that converts the toxic waste to useable product streams.

Another object of the present invention is to provide a method to process thin film photovoltaic waste that removes hazardous metals from scrap thin film photovoltaic cells and photovoltaic manufacturing waste.

Another object of this invention is to provide a method to process thin film photovoltaic waste that removes cadmium and tellurium from waste originating from CdTe photovoltaic cells and their manufacture in a cost-efficient manner.

Another object of this invention is to provide a method to process thin film photovoltaic waste that electrolytically separates cadmium from tellurium in a leachate.

Another object of this invention is to provide a method to process thin film photovoltaic waste that removes the photoactive metals from defective cells and recycles the metals and conducting glass plates for reuse in photovoltaic cell manufacture.

Another object of this invention is to provide a method to process thin film photovoltaic waste that removes hazardous metals from glass plates in scrap photovoltaic cells in order that the glass can be recycled or sent to a landfill.

Another object of this invention is to provide a method to process thin film photovoltaic waste that enables the waste to pass TCLP.

BRIEF DESCRIPTION OF THE DRAWINGS

The foregoing and other objects will become more readily apparent by referring to the following detailed description and the appended drawings in which.

DETAILED DESCRIPTION

Figure 1:
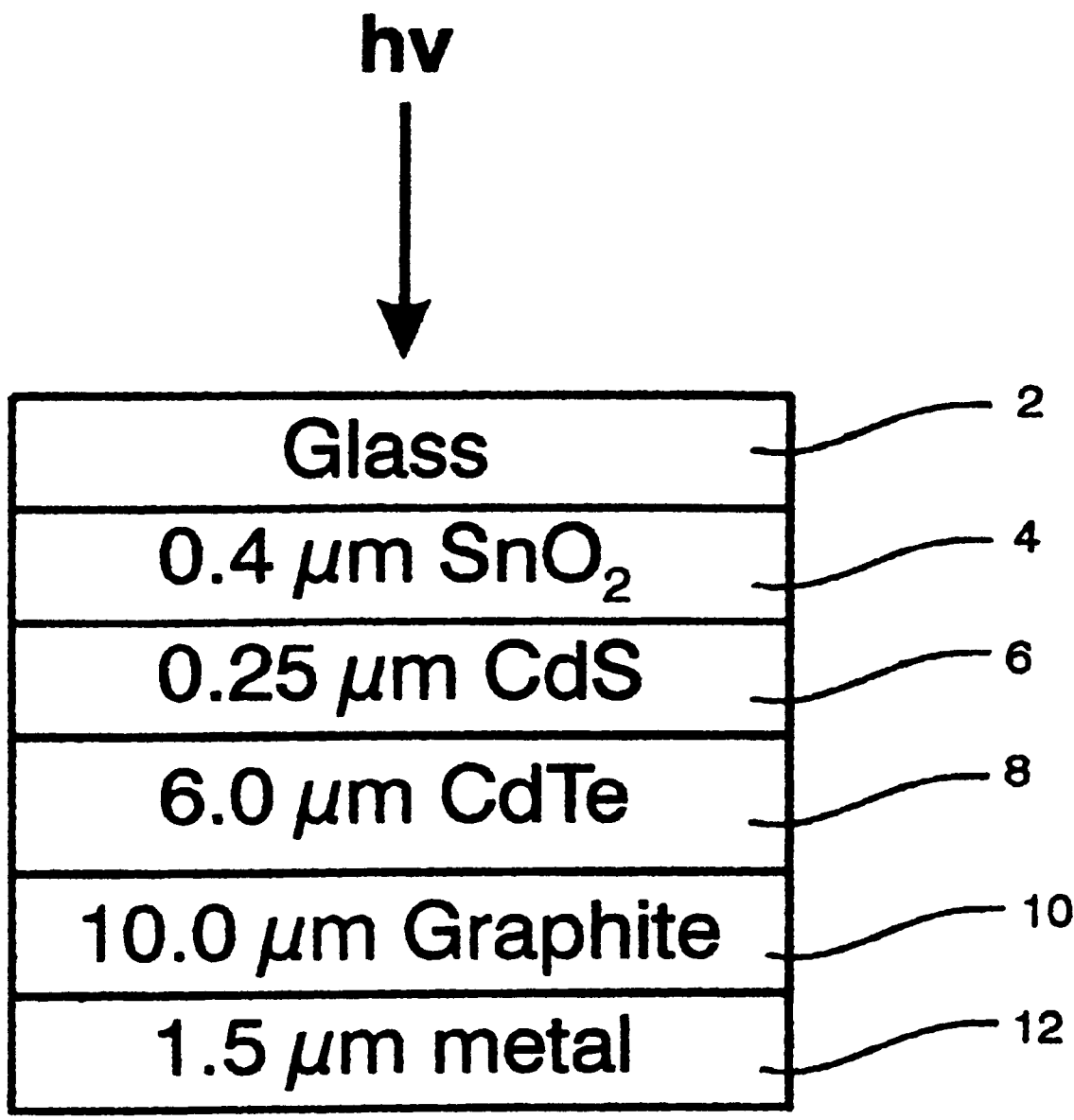
FIG. 1 is a schematic cross-section of a CdTe photovoltaic plate showing the current state of the art.

FIG. 1 is a schematic cross-section of a CdTe photovoltaic plate showing the current state of the art. The CdTe photovoltaic plate contains an approximately 2 mm layer of glass 2 on which is deposed consecutive layers of an approximately 0.4 $\mu$m layer of $SnO_2$ 4, an approximately 0.25 $\mu$m layer of CdS 6, an approximately 6.0 $\mu$m layer of CdTe 8, an approximately 10.0 $\mu$m layer of graphite 10, and an approximately 1.5 $\mu$m layer of metal 12. The direction of the incident light, hv, is denoted by the arrow.

The CdTe photovoltaic plate, as is shown in FIG. 1, is assembled into a finished cell. This usually entails laminating the photovoltaic plate onto another glass plate, usually with an interstitial layer of EVA plastic. The required electrical connectors are attached, by soldering or other means, to the edge of the laminate. The complete photovoltaic cell is then assembled by enclosing the completed laminate in a protective housing.

As shown in FIG. 1, there are metals present in thin film photovoltaic cells which have toxic characteristics and are environmentally hazardous. These metals, which include Cd and Te, must be removed so that manufacturing rejects and consumed PV cells can pass EPA TCLP and be disposed in an environmentally acceptable manner.

Figure 2:
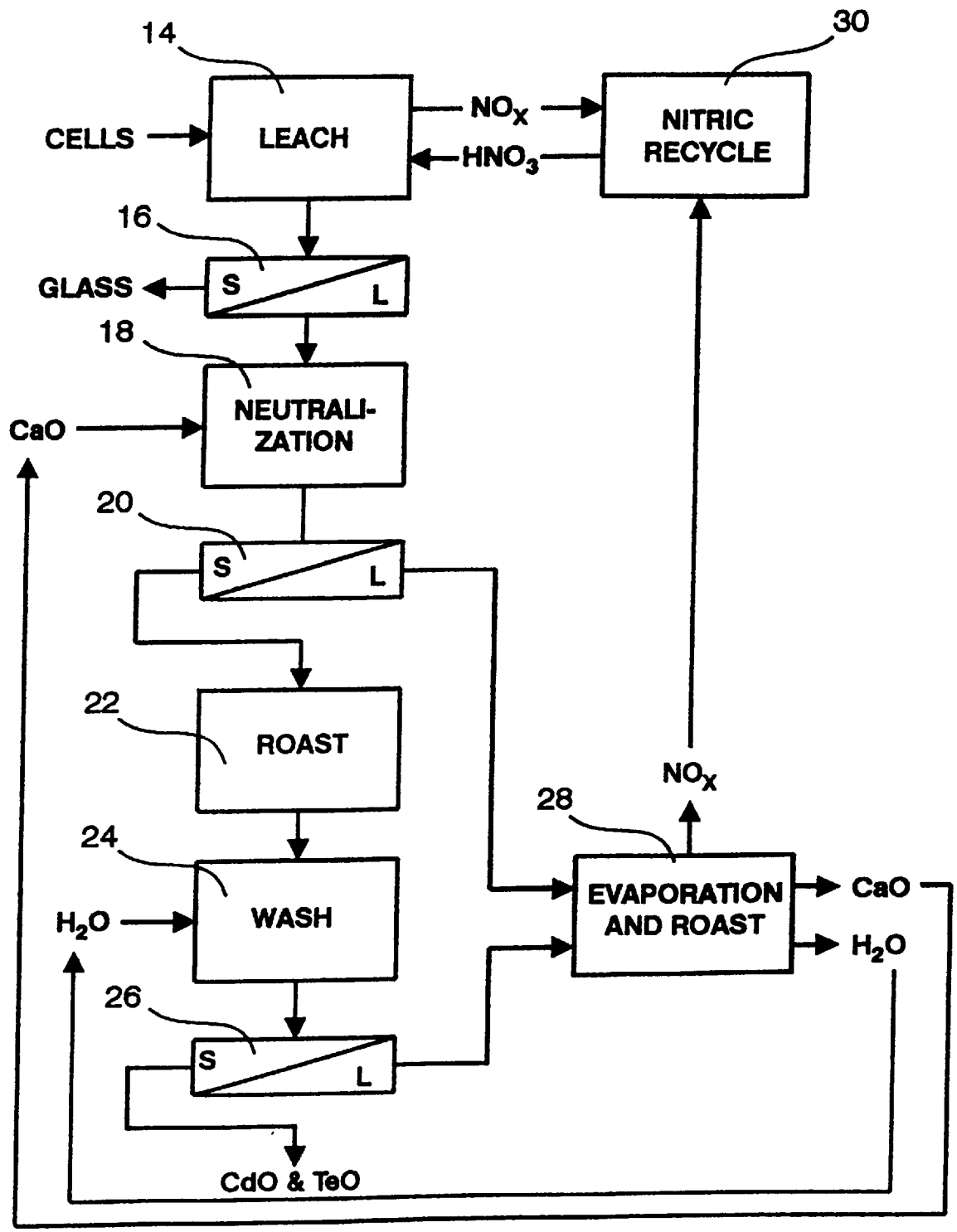
FIG. 2 is a flow diagram process for reclaiming metals from CdTe photovoltaic cells and photovoltaic manufacturing waste in accordance with the present invention.

FIG. 2 is a flow diagram process for reclaiming metals from CdTe photovoltaic cells and photovoltaic manufacturing waste in accordance with the present invention. The cells or modules are first shredded to reduce the size to approximately pea-sized pieces. This can be accomplished by a counter-rotating knife shredder, such as one manufactured by O&E Machine Tools or Muffin Monster. Manufacturing waste, such as sandblasting beads or waste solutions, do not need to be shredded. Shredding the cells or modules delaminates and exposes the PV metals to acid attack. Shredding the cells or modules also reduces the size of the glass plate and makes recovery of glass difficult. If the cells are not laminated or if they are delaminated by hand, shredding is not required and they are treated directly with a leaching solution. By not shredding cells, glass can be recovered from the substrate for reuse in the manufacture of PV cells.

Referring to FIG. 2, the cells and waste are leached 14 to remove the metals. A leachate is formed by leaching the cells and waste with a leaching solution. The leaching solution, which can also be referred to as a lixivant, comprises an aqueous solution of nitric acid ($HNO_3$) having a nitric acid concentration of from about 5% to about 70% by weight and preferably from about 10% to about 60% by weight. Most preferably, a leaching solution having a nitric acid concentration of from about 50% to about 60% by weight of nitric acid solution is used. When a leaching solution having a nitric acid concentration of about 50% to about 60% by weight is used, the EVA laminating plastic delaminates and floats to the top of the leaching solution for convenient removal by skimming. Nitric acid is preferably used as the lixivant, because it is the only mineral acid which by itself has the ability to both acidify and oxidize. In comparison, sulfuric acid requires the addition of hydrogen peroxide or oxygen under pressure to enable it to be used as an oxidizing lixivant.

During the leach, the deposed metals are oxidized and solubilized into the leach solution. Surprisingly, the $SnO_2$ layer is not removed by the nitric acid leaching solution. If unshredded plates are leached, the photoactive metal layers can be removed, and the glass plate, still retaining the conductive $SnO_2$ layer, can be recycled and reused to manufacture PV cells. NOx gas is evolved during the leach, and the NOx can be sent to a recycle 30 to form nitric acid for use in subsequent leaches. By recycling nitric acid, the environmental impact of recycling photovoltaic waste is minimized and cost-efficient use of the nitric acid is optimized.

The temperature of the leach step 14 can range from about 20° C. to about the reflux temperature of the leaching solution. The reflux temperature of the leaching solution can be up to about 120° C., depending upon the concentration of the $HNO_3$ and the concentration of the dissolved metals. The preferred leaching temperature is in the range of from about 80° C. to about the reflux temperature of the leaching solution. The most preferred leaching temperature is the reflux temperature of the leaching solution because the temperature is self-regulating at reflux and the metal dissolution kinetics are most favorable at higher temperatures. The leach step is performed for a period of time until all the photoactive metals are dissolved and any plastic present delaminates and floats to the top of the leaching solution. The metals generally dissolve before about 1 hour has elapsed, but any plastic present may take up to about 4 hours to delaminate. The optimal temperature and leach solution concentration to achieve both metal dissolution and plastic delamination and removal is the reflux temperature of the leaching solution and about 50% nitric acid concentration in the leaching solution. Higher concentrations of $HNO_3$ were observed to oxidize and solubilize the plastic, thereby preventing its removal by skimming.

Referring to FIG. 2, decantation or filtration 16 of the leach mixture separates the glass from the leachate. The glass is free of environmentally hazardous metals and can be recycled or sent to a landfill. When forming the leachate, a solid substrate of laminating plastic and glass plate (if unshredded) is formed that passes TCLP. The acidic leachate is neutralized in the neutralization step 18 by the addition of base. Calcium-containing bases are preferably used. The most preferred neutralization base is CaO, but $CaCO_3$ or limestone can also be used. Sufficient base is added to raise the pH to the range of about 6 to about 9, preferably to a pH of about 7, so that all solubilized metals precipitate. The temperature of the precipitating step is carried out at a temperature of from about 20° C. to about 100° C., and preferably carried out at a temperature of about 80° C. The solid precipitate of Cd and Te is removed by a filtration or separation step 20. The precipitate is roasted 22 at a temperature of up to about 500° C. and preferably at a temperature of from about 400° C. to about 450° C. to convert the Cd and Te to metal oxides while the calcium remains unconverted in the nitrate form. The roasted solid is allowed to cool to ambient temperature and is repulped in a wash 24 with water to solubilize the calcium while leaving the Cd and Te as insoluble oxides.

Filtration or separation 26 of the mixture liberates a CdO and Teo mixture which can be converted back to a metal by a reductive roast or other reducing means. The reduced mixture of metals can then be reused in the manufacture of PV cells or sold to a refiner. The liquid fraction from the filtration step 20 is evaporated and the residue is roasted 28 at high temperatures greater than about 500° C. and preferably at or greater than about 650° C. to convert the $Ca(NO_3)_2$ to CaO. The CaO can be reused in the process in the neutralization step 18. NOx gas evolved during this stage can be captured and recycled 30 as nitric acid for reuse in the leach step 14. Water from the evaporation and roast step 28 can be sent for reuse in the wash step 24. The reusable product streams of CaO, nitric acid and water, in addition to the recycled PV metals, contribute to overall cost-efficiency and minimization of environmental impact.

Figure 3:
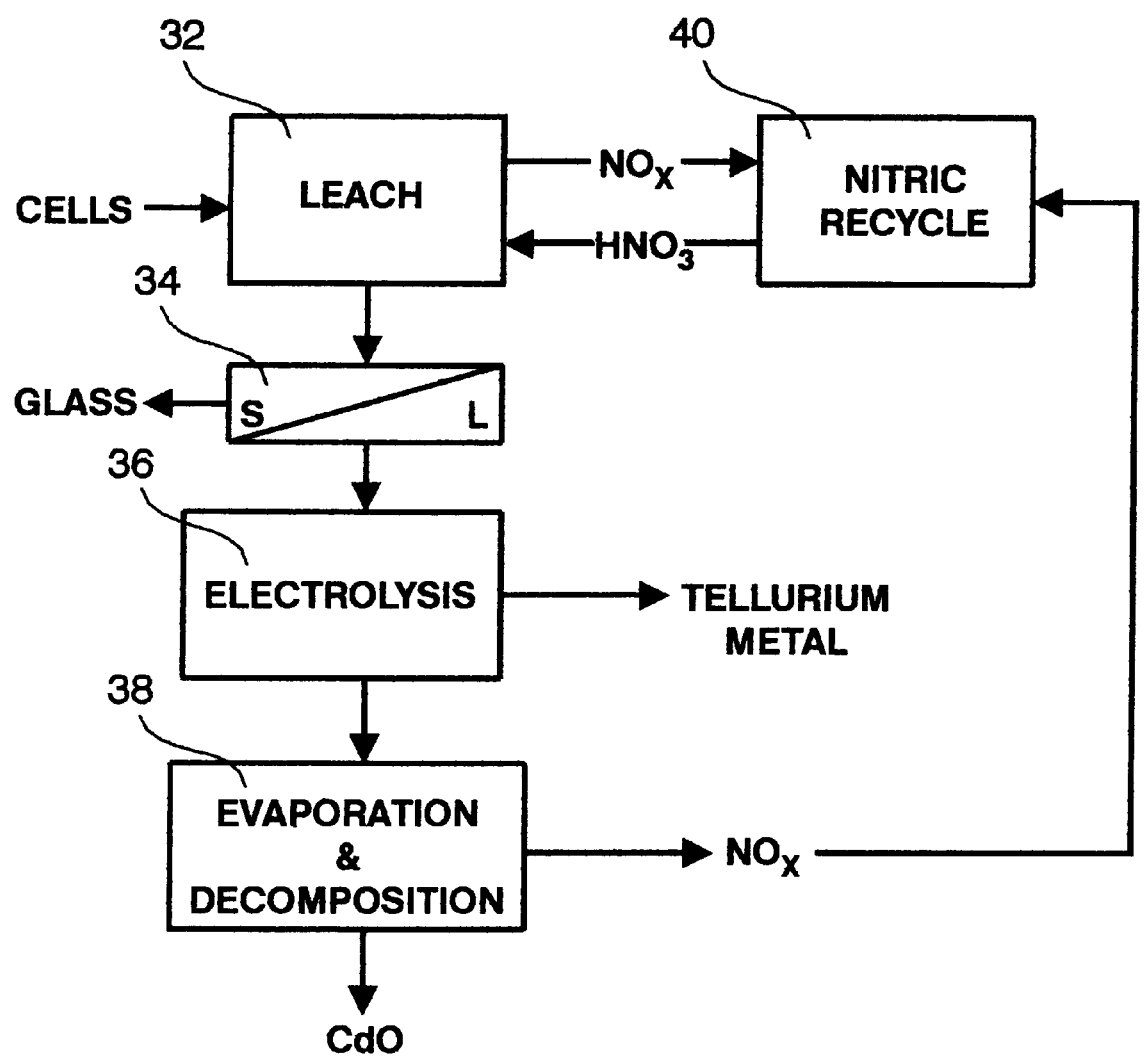
FIG. 3 is a flow diagram of an alternative embodiment, a simplified process, for reclaiming metals from CdTe photovoltaic cells and photovoltaic manufacturing waste in accordance with the present invention.

FIG. 3 is a flow diagram of an alternative embodiment, a simplified process, for reclaiming metals from CdTe photovoltaic cells and PV manufacturing waste in accordance with the present invention. When only Cd and Te are solubilized into the leaching solution, the simplified process is preferably applied. The cells or modules can be first shredded to reduce the size to approximately pea-sized pieces. The function of the shredding is to delaminate the cells and expose the metals to acid attack. If the cells are not laminated or if they are delaminated by hand, they can be treated directly by the leaching solution. The advantage of not shredding cells is to enable the recovery of the glass or substrate for reuse in the manufacture of PV cells.

A leachate is formed by leaching the cells and waste with a leaching solution. The cells and waste are leached in a leach step 32 to remove the metals. The lixivant or leaching solution comprises an aqueous solution of $HNO_3$ having a nitric acid concentration of from about 5% to about 70% $HNO_3$ by weight and preferably from about 10% to about 60% by weight. Most preferably, a leaching solution having a nitric acid concentration of from about 50% to about 60% by weight of $HNO_3$ is used. When a leaching solution of from about 50% to about 60% by weight of nitric acid is used, the EVA laminating plastic is observed to delaminate and float to the top of the leaching solution where it can be readily removed by skimming. During the leach, the deposed metals are oxidized and solubilized into the leach solution. Surprisingly, the $SnO_2$ layer is not removed by the nitric acid leaching solution. If unshredded plates are leached, the photoactive metal layers can be removed, and the glass plate, still retaining the conductive $SnO_2$ layer, can be reused to manufacture PV cells. NOx gas evolves, and the NOx can be sent to a recycle 40 to form nitric acid for use in subsequent leaches.

The temperature of the leach step 32 can range from about 20° C. to about the reflux temperature of the leaching solution. The reflux temperature of the leaching solution can be up to about 120° C., depending upon the concentration of the $HNO_3$ and the concentration of the dissolved metals. The preferred leaching temperature is from about 80° C. to about the reflux temperature of the leaching solution. The most preferred temperature is the reflux temperature of the leaching solution because the temperature is self regulating at reflux and the metal dissolution kinetics are most favorable at higher temperatures. The leach step 32 is performed for a period of time until all the photoactive metals are dissolved and any plastic present delaminates and floats to the top of the leaching solution. The metals generally dissolve before about 1 hour has elapsed, but any plastic present may take up to about 4 hours to delaminate. The optimal temperature and leach solution concentration to achieve both metal dissolution and plastic delamination and removal is the reflux temperature of the leaching solution and about 50% $HNO_3$ concentration in the leaching solution. Higher concentrations of $HNO_3$ were observed to oxidize and solubilize the plastic, thereby preventing its removal by skimming.

Separation by filtration 34 of the leach mixture separates the glass from the leachate. The mixture can also be separated by settling and decantation. The separated glass is free of environmentally hazardous metals and can be recycled or sent to a landfill. When forming the leachate, a solid substrate of laminating plastic and glass plate (if unshredded) is formed that passes TCLP.

The leachate contains solubilized Cd and Te. The leachate is then electrolyzed 36 using a pair of Pt electrodes, comprising a cathode and an anode, and a power source attached to the electrodes. A D.C. voltage or electromotive force (emf) of up to about 4 volts and preferably from about 2 to about 3 volts is supplied during electrolysis by the power source. In a preferred embodiment of the present invention, the leachate is electrolyzed at an emf of about 2.25 volts. The current involved is up to about 4 amperes, and the preferred current is about 3.4 amperes. The current density involved is up to about 0.0468 amperes/$cm^2$, and the preferred current density is up to about 0.0398 amperes/$cm^2$. The current density is defined by the current provided to the electrode per unit of surface area of the electrode. Alternative electrode materials include but are not limited to carbon, stainless steel and platinized stainless steel. The electrolysis 36 is carried out at a temperature of from about 20° C. to about 60° C. The electrodes can rotate or be stationary, and the cathodes preferably have a surface area of about 85.4 $cm^2$. Tellurium metal deposits on the cathode while oxygen forms at the anode. Quite unexpectedly, cadmium remained in solution. Electrolyzing the leachate caused a virtually complete separation of the tellurium as a metal while leaving the cadmium in the effluent solution. Evaporation of the effluent solution followed by decomposition of the evaporation residue 38 at moderate temperatures of preferably less than about 450° C., and most preferably from about 400° C. to about 450° C., yielded a CdO product suitable for recycling back to PV cell manufacture or for sale.

When only Cd and Te are solubilized in the leaching solution, the recycling of photovoltaic metals is further simplified while creating directly reusable streams of product such as nitric acid and glass in addition to the PV metals.

EXAMPLES

Example 1

Extraction of CdTe PV Cells

Scrap CdTe photovoltaic plates are pulverized to approximately pea sized pieces and reacted with 25% nitric acid at 106° C. reflux for 4 hours. The ratio of PV scrap to lixivant was 60 g of scrap to 300 g of lixivant. The level of Cd and Te in the leachate for 3 experimental runs are shown in the table below.

| RESULTS FOR NITRIC ACID EXTRACTION OF CdTe SCRAP CELLS | | |
|---|---|---|
| Experiment No. | Cd Concentration (ppm) | Te Concentration (ppm) |
| 1 | 96.9 | 98.7 |
| 2 | 95.5 | 95.5 |
| 3 | 103.7 | 114.25 |

The results show that Cd and Te were well dissolved into the nitric acid. The solid substrate from the leach was observed to pass EPA TCLP testing.

Example 2

Reuse of Lixivant Solution

In a stepwise leaching experiment, 1300 g of 25% nitric acid was used to leach 5 consecutive portions of pulverized CdTe cells to achieve a leach of 300 g of modules. Each leach was for 4 hours at 106° C. reflux.

| RESULTS FOR 5X NITRIC ACID EXTRACTION OF CdTe SCRAP CELLS | | | |
|---|---|---|---|
| Experiment No. | Cd Concentration (ppm) | Te Concentration (ppm) | Sn Concentration (ppm) |
| 1 | 1277 | 1314 | 11.3 |

The results show that reuse of the lixivant solution produces an appreciable concentration of Cd and Te while the level of Sn is very low.

Example 3

Raising the pH to Precipitate Cadmium and Tellurium

A 281 g sample of 1% Cd and 1% Te in 25% nitric acid was heated to 80° C. A CaO slurry was added to the solution until the pH of the mixture reached 7. The filtrates and residues were weighed and analyzed using ICP to establish the precipitation of Cd and Te.

RESULTS FOR NITRIC ACID EXTRACTION OF CdTe SCRAP CELLS

| Experiment No. | Cd Precipitation (%) | Te Precipitation (%) |
|---|---|---|
| 1 | 99 | 100 |
| 2 | 99 | 100 |

The results show the effectiveness of CaO as a neutralizer and as a precipitating agent for Cd and Te.

Example 4

Electrolysis of Leachate Solution

The experiment electrolyses 250 g of 1% (10,000 ppm) Cd and 1% (10,000 ppm) Te dissolved in 2M $HNO_3$ at 0.0398 amperes/$cm^2$ and 2.25 volts using rotating Pt electrodes for 2 hours. The results for 3 experimental runs are below.

ELECTROLYSIS RESULTS FOR THE SEPARATION OF CD AND TE

| SAMPLE ID | FILTRATE CONC. (ppm) | | % METALS RECOVERED | |
|---|---|---|---|---|
| | Cd | Te | Cd | Te |
| 1 | 10,001 | 499 | 0 | 95 |
| 2 | 10,763 | 226 | 0 | 98 |
| 3 | 9,648 | 369 | 4 | 96 |

The results show the recovery of virtually pure Te without contamination by Cd using electrolysis.

SUMMARY OF THE ACHIEVEMENT OF THE OBJECTS OF THE INVENTION

From the foregoing, it is readily apparent that we have invented a method to process thin film photovoltaic waste that converts the toxic waste to useable product streams. The present invention provides a method to process thin film photovoltaic waste that removes hazardous metals from scrap thin film photovoltaic cells and photovoltaic manufacturing waste. The present invention provides a method to process thin film photovoltaic waste that removes cadmium and tellurium from waste originating from CdTe photovoltaic cells and their manufacture in a cost-efficient manner. The present invention provides a method to process thin film photovoltaic waste that electrolytically separates cadmium from tellurium in a leachate. The present invention provides a method to process thin film photovoltaic waste that removes the photoactive metals from defective cells and recycles the metals and conducting glass plates for reuse in photovoltaic cell manufacture. The present invention provides a method to process thin film photovoltaic waste that removes hazardous metals from glass plates in scrap photovoltaic cells in order that the glass can be recycled or sent to a landfill. The present invention provides a method to process thin film photovoltaic waste that enables the waste to pass TCLP.

It is to be understood that the foregoing description and specific embodiments shown herein are merely illustrative of the best mode of the invention and the principles thereof, and that modifications and additions may easily be made to the apparatus by those skilled in the art without departing from the spirit and scope of the invention, which is therefore understood to be limited only by the scope of the appended claims.

What is claimed is:

1. A method for extracting and reclaiming metals from scrap CdTe photovoltaic cells and manufacturing waste comprising the steps of:

forming a solid substrate and a leachate by leaching the photovoltaic cells and manufacturing waste with a solution comprising nitric acid and water;

adding a calcium-containing base to precipitate a solid comprising Cd and Te;

roasting the solid at a temperature less than 500° C., washing the solid with water;

evaporating the water to leave a residue; and roasting the residue to obtain CaO.

2. A method according to claim 1 wherein said solid substrate passes TCLP.

3. A method according to claim 1 wherein the solution has a nitric acid concentration of from about 5% to about 70%.

4. A method according to claim 1 wherein the solution has a nitric acid concentration of from about 10% to about 50%.

5. A method according to claim 1 wherein the solution has a reflux temperature, and wherein forming a solid substrate is carried out at a temperature of from about 20° C. to about the reflux temperature of the solution.

6. A method according to claim 1 wherein the solution has a reflux temperature, and wherein forming a solid substrate is carried out at a temperature of from about 80° C. to about the reflux temperature of the solution.

7. A method according to claim 1 wherein the solution has a reflux temperature, and wherein forming a solid substrate is carried out at the ref lux temperature of the leaching solution, and wherein the solution has a nitric acid concentration of about 50%.

8. A method according to claim 1 wherein forming a solid substrate is performed for a sufficient period of time for any plastic in the solid to delaminate and float to the top of the solution.

9. A method according to claim 1 wherein adding a calcium-containing base is carried out at a temperature of from about 20° C. to about 100° C.

10. A method according to claim 1 wherein adding a calcium-containing base is carried out at a temperature of about 80° C.

11. A method according to claim 1 wherein roasting the solid is carried out at a temperature of from about 400° C. to about 450° C.

12. A method according to claim 1 wherein roasting the residue is carried out at a temperature of at least about 600° C.

13. A method according to claim 1 wherein roasting the residue is carried out at a temperature of about 650° C.

* * * * *